United States Patent
Carroll

(12) 
(10) Patent No.: US 6,414,322 B1
(45) Date of Patent: Jul. 2, 2002

(54) SAMPLE MOUNT FOR A SCANNING ELECTRON MICROSCOPE

(75) Inventor: Lynn J. Carroll, Boise, ID (US)

(73) Assignee: Micron Technology, Inc., Boiae, ID (US)

(*) Notice: Subject to any disclaimer, the term of this patent is extended or adjusted under 35 U.S.C. 154(b) by 0 days.

(21) Appl. No.: 09/237,283

(22) Filed: Jan. 25, 1999

(51) Int. Cl.7 .................................................. H01J 37/20
(52) U.S. Cl. .................................................. 250/442.11
(58) Field of Search ........................ 250/442.11, 440.11, 250/310

(56) References Cited

U.S. PATENT DOCUMENTS

| | | | | |
|---|---|---|---|---|
| 4,349,242 A | * | 9/1982 | Ogura ........................ | 250/310 |
| 4,943,148 A | | 7/1990 | Mondragon et al. ........ | 350/529 |
| 5,033,834 A | | 7/1991 | Corder et al. ............... | 350/529 |
| 5,923,040 A | * | 7/1999 | Carroll ...................... | 250/442.11 |
| 6,184,533 B1 | * | 2/2001 | Shirai et al. ............... | 250/442.11 |

* cited by examiner

Primary Examiner—Kiet T. Nguyen
(74) Attorney, Agent, or Firm—Schwegman, Lundberg, Woessner & Kluth, P.A.

(57) ABSTRACT

A sample mount and method is disclosed for securing a semiconductor wafer sample to a generic base of a scanning electron microscope. The mount has two opposing clamp members that move relative to one another in response to rotational input to a lead screw. By placing a sample between the clamp members and rotating the lead screw, the samples may be clamped for inspection. When inspection is complete, the lead screw may be rotated in the opposite direction to release the clamping hold on the sample. The clamp members are adjustable to hold varying thicknesses and numbers of specimens making up the sample. In one embodiment, both clamp members move symmetrically from a common origin. In yet another embodiment, one clamp member is fixed relative to the mount and the other clamp member moves relative thereto.

45 Claims, 4 Drawing Sheets

SAMPLE MOUNT FOR A SCANNING ELECTRON MICROSCOPE

FIELD OF THE INVENTION

The present invention pertains to electron microscopes. Specifically, this invention pertains to a sample mount for use with a scanning electron microscope.

BACKGROUND OF THE INVENTION

The semiconductor wafer fabrication process relies heavily on physical inspection processes to ensure product quality. Due to the minute size of the wafer features, highly specialized equipment is required. This equipment typically includes a variety of viewing instruments such as microscopes which permit a technician to accurately magnify and view specific features of the wafer sample.

For various reasons, conventional optical microscopes are ill-fitted for wafer inspection. For example, they are limited in their ability to resolve detail at a level sufficient to enable adequate wafer examination. Additionally, they are unable to achieve the required magnification levels. Furthermore, depth-of-field (i.e., the ability to keep objects at two different depths simultaneously in focus) is restricted, requiring the operator to constantly re-focus the microscope as different areas of the sample are inspected.

These drawbacks are eliminated by using a scanning electron microscope (SEM). Unlike an optical microscope, the SEM utilizes an electron beam to bombard the sample as it sits within a vacuum environment. Due to the characteristics of the electron beam (as opposed to the visible light source used in optical microscopes), resolution and magnification are significantly increased. Additionally, no depth-of-field problems exist with the SEM so surfaces at any depth can be examined without re-focusing. These advantages have made the SEM essential to the wafer inspection process.

Before viewing the wafer sample in the SEM, the wafer must be securely mounted. Typically, the microscope includes a movable base to facilitate specimen mounting. However, an appropriate sample mount is necessary to secure the sample to the base. The sample mount used varies depending on the wafer features to be inspected. For example, sample mounts are known for inspecting the face of the wafer while other mounts permit inspection of wafer edge features. The present invention is addressed to the latter and the remainder of this discussion is directed accordingly.

One apparatus is described by the Applicant herein in a co-pending, commonly assigned application entitled "Wafer Sample Retainer for an Electron Microscope", filed on Dec. 1, 1997 having Ser. No. 08/980,932.

For semiconductor wafers, inspection of edge features is usually accomplished by securing several wafers together and mounting the sample in a vertical orientation relative to the SEM. The mount typically consists of a vertical member to which one or more wafer specimens are secured using a curable adhesive. Copper tape is then wrapped around the specimens and the mount to secure the sample. While such mounts have proven effective, drawbacks exist. For example, the application and removal of the tape adds additional steps to the inspection process. Additionally, the curable adhesive may require several hours to cure prior to inspection. Furthermore, periodic cleaning of the fixture may be required to remove adhesive residue.

Thus, there are issues concerning increased setup time with current semiconductor sample retaining devices. As wafer fabrication facilities continue to increase production rates, the total number of wafers inspected must also increase. As a result, there is a need for a sample mount that provides quick and effective mounting without the drawbacks inherent with adhesives.

SUMMARY OF THE INVENTION

A sample mount for an scanning electron microscope (SEM) is disclosed in which the mount comprises a first clamp member, a second opposing clamp member, and a lead screw operatively connected to both clamp members. Rotation of the lead screw varies the distance between the clamp members. A method for retaining a sample for examination in a SEM is also disclosed comprising securing a sample mount to a base, inserting a sample into the sample mount, and turning a lead screw in a first direction to move a first clamp member toward a second clamp member, thereby securing the sample therebetween.

The sample may be a single silicon wafer or a plurality of wafers. Various sample thicknesses may be accommodated by merely turning the lead screw to move the clamp members relative to one another.

The sample mount may be removably mounted to a base on the SEM. The SEM may further include a rail in which the base is adjustably positionable. The base may be positionable with a motor-driven screw.

In one embodiment, both clamp members are movable relative to the base. In another embodiment, one clamp member is fixed relative to the base and the other clamp member moves relative thereto.

The sample mount may comprise a retaining assembly having a plate and a clamp body removable attached to the plate. A first and second clamp member may be operatively connected to the retaining assembly whereby the clamp members are capable of securing a sample therebetween. A lead screw may be secured to the retaining assembly and operatively connected to the first and second clamp members, whereby rotation of the lead screw varies the distance between the clamp members. A thumb-wheel may be provided at one end of the lead screw to assist the operator in turning the screw. The retaining assembly, first and second clamp members, and the lead screw may all be removably secured to a base on the SEM.

In one embodiment, the lead screw may comprise a central threaded portion having a first threaded portion and a second threaded portion wherein the first threaded portion has a right-handed thread and the second threaded portion has a left-handed thread. The first clamp member is threadably engaged to the first threaded portion of the lead screw and the second clamp member is threadably engaged to the second threaded portion such that rotation of the lead screw in a first direction results in relative closure of the clamp members. Alternatively, rotation of the lead screw in a second direction results in relative separation of the clamp members. Regardless, the clamp members move relative to a common origin.

The present invention provides an improved sample mount that permits quick and efficient edge mounting of wafer samples within a SEM. Furthermore, mounting is accomplished without the use of messy adhesives and tapes. By avoiding the use of adhesives, the sample mount does not require the lengthy cure time often associated with adhesive mounts. Advantageously, inspection throughput is increased, preventing wafer inspection from becoming a production bottleneck.

BRIEF DESCRIPTION OF THE DRAWINGS

The invention described herein will be further characterized with reference to the drawings, wherein.

DETAILED DESCRIPTION OF THE EMBODIMENTS

In the following detailed description of the embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1:
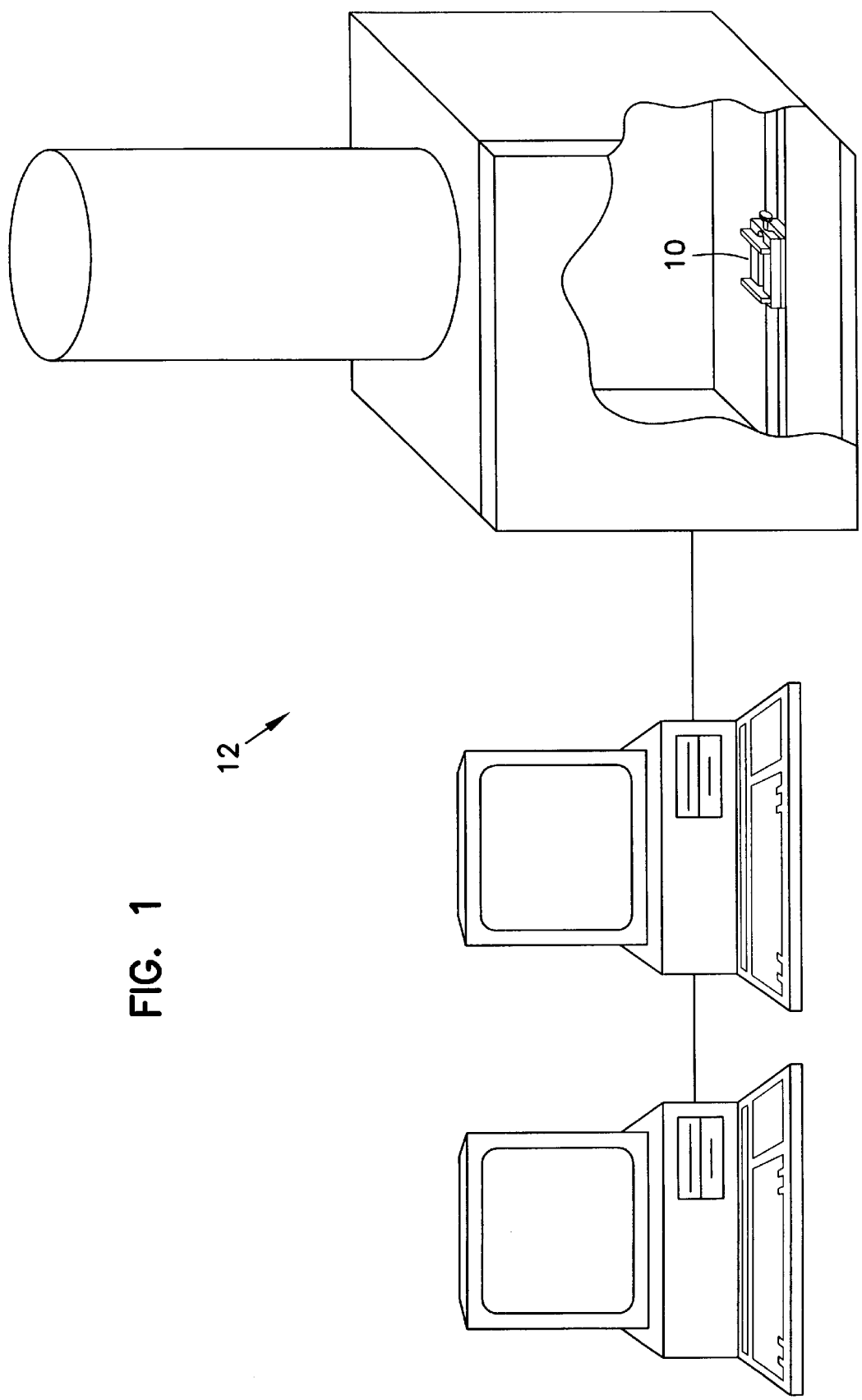
FIG. 1 is a perspective view of a SEM showing a sample mount in accordance with one embodiment of the present invention.
Figure 2:
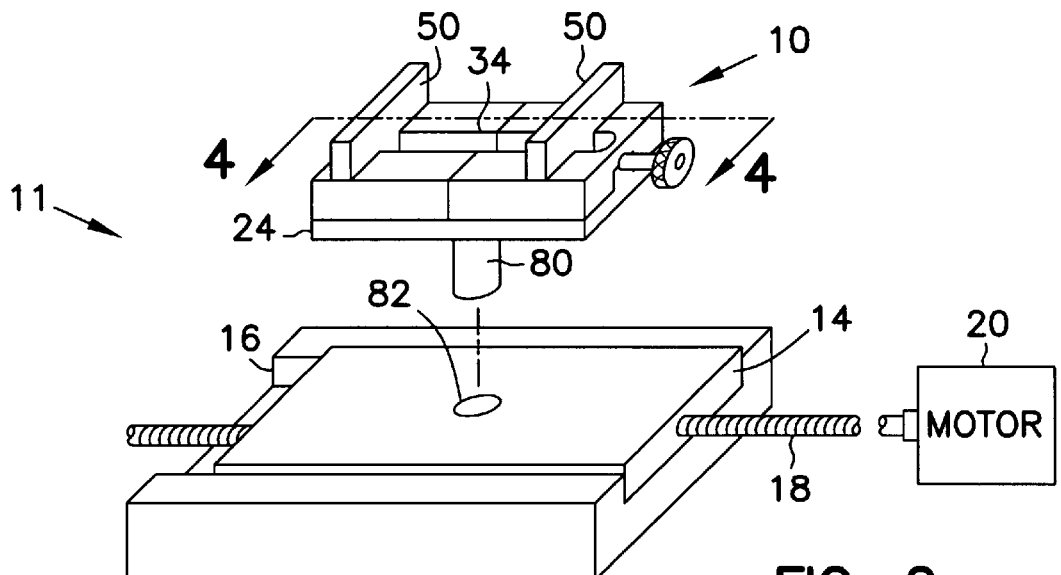
FIG. 2 is a diagrammatic perspective view of one exemplary embodiment of the sample mount in accordance with the present invention.

FIG. 1 shows a perspective view of one embodiment of a sample mount 10 in accordance with the present invention as it would be installed in a generic scanning electron microscope (SEM) 12. Referring to FIG. 2, a sample mounting assembly 11 includes the sample mount 10 and a base 14 to which the sample mount 10 is secured. The base 14 is positionable along a rail 16 and may be externally driven by a drive screw 18 operably connected to a drive motor 20. Alternatively, the base 14 may be manually positionable by a variety of devices known in the art or by hand. By selectively engaging the drive motor, the base 14 may be located at a point along the rail 16 that provides optimal sample viewing. The sample mount 10 extends upwardly from the base 14 to retain a wafer sample 22 (shown in FIG. 4) for viewing under the SEM. The sample may consist of one or more semiconductor wafer specimens of equal or varying thickness.

Figure 3:
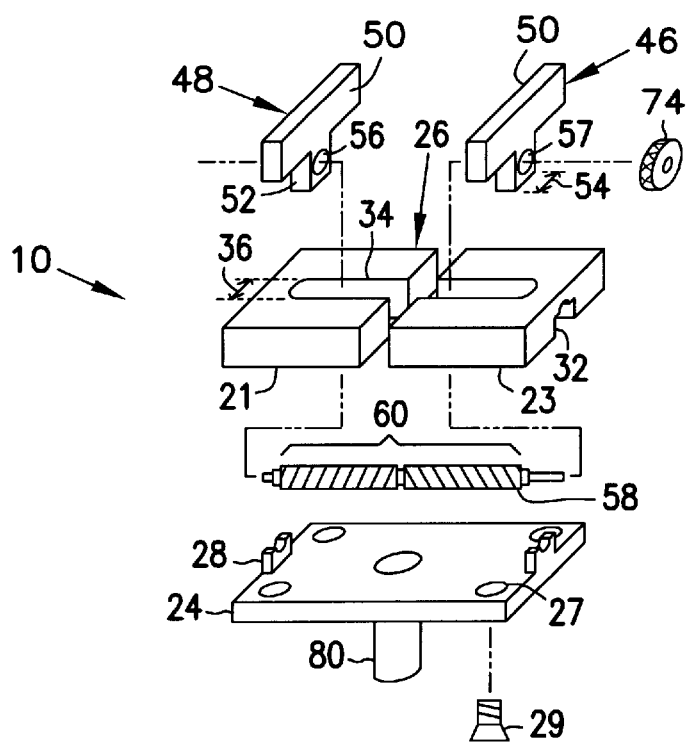
FIG. 3 is an exploded perspective view of the sample mount of FIG. 2.
Figure 4:
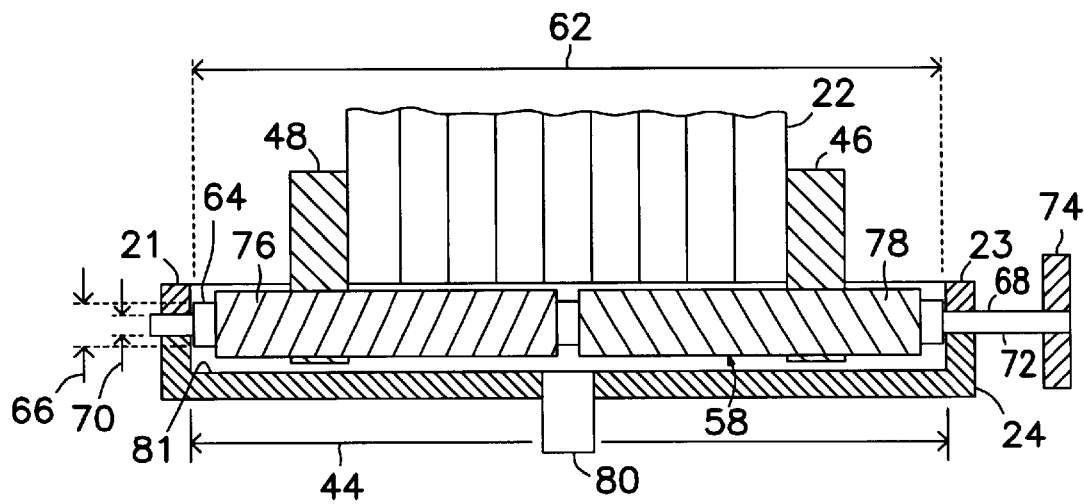
FIG. 4 is a partial section view taken along line 4—4 of FIG. 2 wherein the clamp body, the clamp plate, the clamp members, and the thumb-wheel are shown in section.
Figure 5:
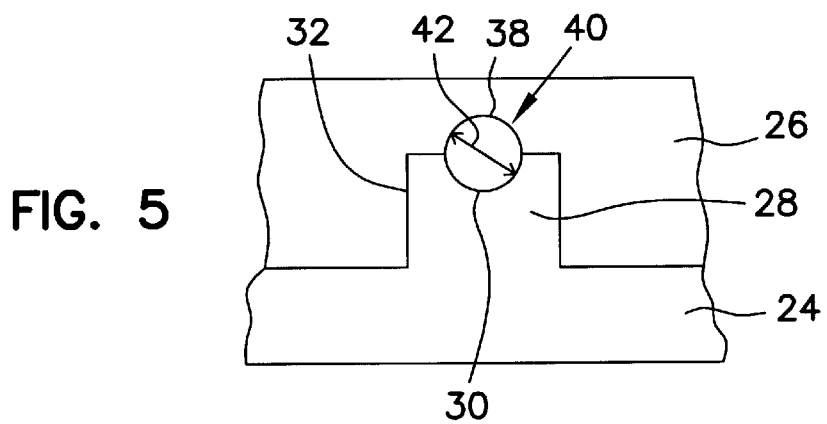
FIG. 5 is an enlarged partial side view of the sample mount of FIG. 2 showing the tab and recess.

With this brief overview, attention will now be focused on one exemplary embodiment of the sample mount 10 of the present invention. Referring generally to FIGS. 3–5, the sample mount 10 comprises a plate 24 and a clamp body 26. The plate 24 and clamp body 26 are substantially equal in size and form a generally rectangular shape in the plan view. The clamp body 26 is formed from two identical half-sections 21 and 23. Each half-section includes two threaded holes (not shown) which, when assembled, are in axial alignment with two of the four fastener holes 27 located in the plate 24. When assembled, four flathead cap screws 29 (only one of which is shown in FIG. 3) secure the plate 24 to the half-sections 21, 23 of the clamp body 26.

Referring particularly to FIG. 3, the plate 24 includes a pair of opposing tabs 28 extending upwardly from a top side. It is noted that the terms "up" and "down" are used throughout the specification only for descriptive purposes and are not intended to limit the scope of the invention in any way. Located on the upper surface of each tab 28 is a first convex radius 30 (best shown in FIG. 5). The purpose of this radius will become apparent shortly. The clamp body 26 has a pair of centrally located opposing recesses 32. Extending between the recesses 32 of the clamp body 26 is a centrally located slot 34 having a slot width 36. The recesses are designed to receive the tabs 28 when the plate 24 and the clamp body 26 are assembled. While the tabs are shown integral to the plate 24, it should be noted that the tabs 28 and recesses 32 could be reversed (i.e., the tab 28 could be integral to the clamp body 26 and the recess 32 could be integral to the plate 24). Such an arrangement would still be within the scope of the invention. As shown in FIG. 5, each recess 32 further includes a second convex radius 38 substantially equal to the first convex radius 30. The construction of tabs 28 and recesses 32 are such that, when the bottom plate 24 is assembled with the clamp body 26, the interrelation of the first and second convex radii 30, 38 form opposing, generally cylindrical openings 40 having a retaining diameter 42. The tabs are spaced apart by a tab separation 44 best shown in FIG. 4.

Referring once again to FIG. 3, the sample mount 10 additionally comprises a first clamp member 46 and a second clamp member 48. The clamp members 46 and 48 are T-shaped members having a first or upper generally horizontal portion 50 and a second or lower generally vertical portion 52. The upper horizontal portions 50 form opposing specimen holding faces. Each lower vertical portion 52 has a width 54 slightly smaller than the slot width 36 so that the lower vertical portion 52 of the clamp members 46, 48 slidably nests within the slot 34. Each lower vertical portion 52 also includes a threaded hole 56, 57 whose purpose will become apparent shortly. Thus, the holding faces 50 are held in a parallel relation to one another (best shown in FIG. 2) by the nesting relationship of the lower vertical portion 52 and the slot 34. However, each clamp member 46, 48 can move toward or away from the other clamp member by merely sliding within the slot 34.

As shown in FIG. 3, a lead screw 58 spans between the cylindrical openings 40 (see FIG. 5). The lead screw has a central threaded portion 60 having a minor thread diameter. At each end of the central threaded portion 60 is a first end portion 64 which is best viewed in FIG. 4. In this embodiment, the first end portion 64 comprises a first non-threaded portion 64 having a first diameter 66 which is smaller than the minor diameter of the central threaded portion 60. The central threaded portion 60 and the first non-threaded portions 64 together define a screw length 62 that is best viewed in FIG. 4. In an alternative embodiment, the first end portion 64 is merely a continuation of central threaded portion 60 such that the central threaded portion 60 extends over the entire screw length 62. Located immediately adjacent and outboard to each first non-threaded portion 64 is a second non-threaded portion 68 having a second diameter 70 which is smaller than the first diameter 66. The second diameter 70 is slightly smaller than the retaining diameter 42 (see FIG. 5) such that each retaining diameter may receive and retain one end of the lead screw 58 by the second diameter 70. The lead screw 58 is also restrained from longitudinal motion by the close fit of the first non-threaded portions 64 and the tabs 28. That is, the screw length 62 is slightly smaller than the tab separation 44, thus restricting lead screw motion along the axis of the lead screw.

Extending from one end of the lead screw 58 is an extended portion 72 of the second non-threaded portion 68. The extended portion 72 is designed to operatively engage a thumb-wheel 74. In the embodiment shown, the thumb-wheel is secured by a press fit to the extended portion 72 but other securing methods (e.g., threaded engagement, staking, set screw) are also within the scope of the invention. The thumb-wheel is preferably knurled on its outer diameter to permit easy turning by hand. While the embodiment shown utilizes the thumb-wheel 74, other features that assist in turning the lead screw 58 (i.e., flathead or Phillips screw head, splined head, alien head, etc.) are also within the scope of the invention.

Referring still to FIGS. 3 and 4, the central threaded portion 60 of the lead screw 58 further comprises a left-hand threaded portion 76 and a right-hand threaded portion 78. When assembled, the left-hand threaded portion 76 threadably engages the threaded hole 56 of the second clamp member 48, which has a left-hand thread, while the right-hand threaded portion 78 threadably engages the threaded hole 57 of the first clamp member 46, which has a right-hand thread. In this way, rotational motion of the lead screw 58 in a first direction causes the clamp members 46, 48 to move closer together while rotation of the lead screw in a second direction causes the clamp members to separate. The operator may, accordingly, change the distance between the clamp members 46, 48 by merely turning the thumb-wheel 74. When the thumb-wheel is turned, the clamp members move toward or away from a common origin. Thus, regardless of variations in sample thickness, the centerline of the sample remains "centered" relative to the base.

The threaded holes 56, 57 and threaded portions 76, 78 are each 6-32 UNC threads (either left-handed or right-handed as described herein). However, those skilled in the art will realize that other thread sizes and standards are also within the scope of the invention.

Referring once again to FIG. 2, the sample mount 10 may also includes a pin 80 extending downwardly from the plate 24. The pin 80 is received by a central opening 82 in the base 14. A socket set screw (not shown) or similar fastener may be threadably engaged with the base 14 normal to the opening 82 to secure the pin 80 relative to the base 14.

Having described the invention in detail, assembly of the sample mount 10 will now be described. First, the pin 80 may be pressed into the plate 24, ensuring that it does not protrude beyond an upper surface 81 (see FIG. 4) of the plate. Next, both clamp members 46, 48 may be threaded onto the lead screw 58. Each clamp member 46, 48 should be threaded to its center-most position (i.e., the clamp faces 50 should be "centered" with respect to the lead screw threaded portion 60). The clamp members and lead screw together may then be placed into either half-section 21 (or 23) such that second diameter 70 of one end of the lead screw 58 is retained within the second convex radius 38 and the first non-threaded portion 64 is in an abutting relation with an inside surface of the clamp body 26 (as generally shown in FIG. 4). The half-section 21 may then be loosely fastened to the plate 24 with two fasteners 29. The other half-section 23 (or 21) may then be attached and similarly fastened to the plate 24 with the remaining fasteners 29. Finally, half-sections 21, 23 may be aligned relative to one another and the fasteners 29 may be tightened to an appropriate torque value. At this point, the lead screw 58 is retained between the plate 24 and the clamp body 26 by the retaining diameters 42 and the clamp members 46, 48 are threadably engaged to the lead screw 58. If not already installed, the thumb-wheel 74 may be attached to the extended portion 72 as shown in FIGS. 2 and 4.

In use, the sample mount 10 is attached to the base 14 by inserting the pin 80 into central opening 82. The mount 10 may be secured with a set screw (not shown) or other conventional means (e.g., threaded or frictional engagement). The specimen sample 22 (as shown in FIG. 4) may be placed between clamp members 46, 48 and the thumb-wheel 74 may be rotated in the first direction. As the thumb-wheel is turned, the clamp members move toward one another until they contact the sample 22. The clamping force applied to the sample 22 can be varied proportionally to the amount of torque applied to the thumb-wheel 74. Adjustment of the sample location relative to the SEM can be made by selectively energizing the motor 20 to drive the base 14 within the rail 16.

To release the sample 22 after inspection, the thumb-wheel 74 is simply rotated in the second direction, thereby releasing the samples from the clamp members 46, 48. A second set of specimens may then be inserted. Due to the combination thread of the lead screw 58, the clamp members move toward and away from a common center or origin. Thus, even if a sample is of different thickness than the previously inspected sample, the center of the sample is always in the same position relative to the base. Accordingly, movement of the base 14 along the rail 16 is minimized.

Figure 6:
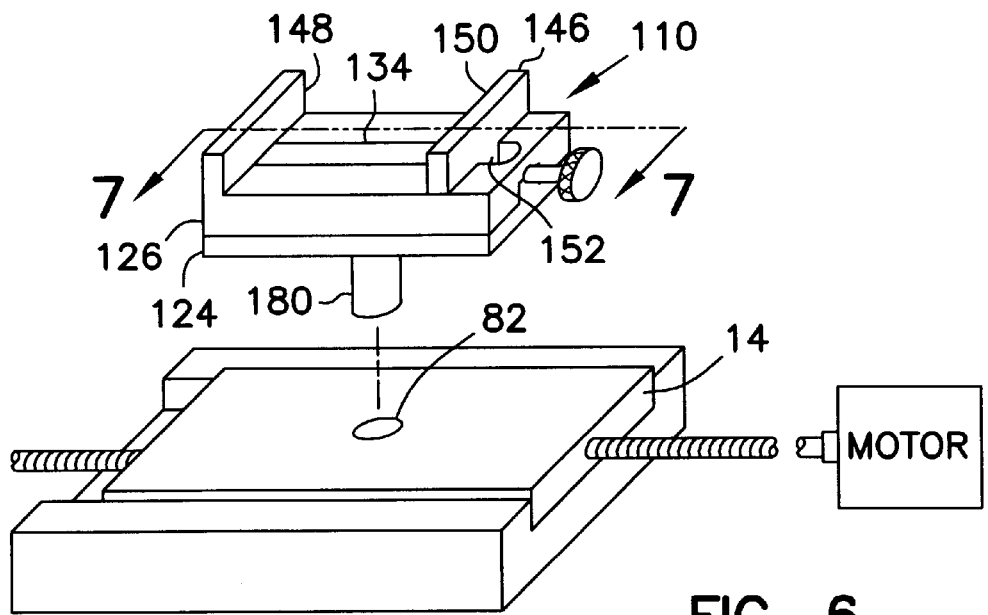
FIG. 6 is a diagrammatic perspective view of another exemplary embodiment of the sample mount in accordance with the present invention.
Figure 7:
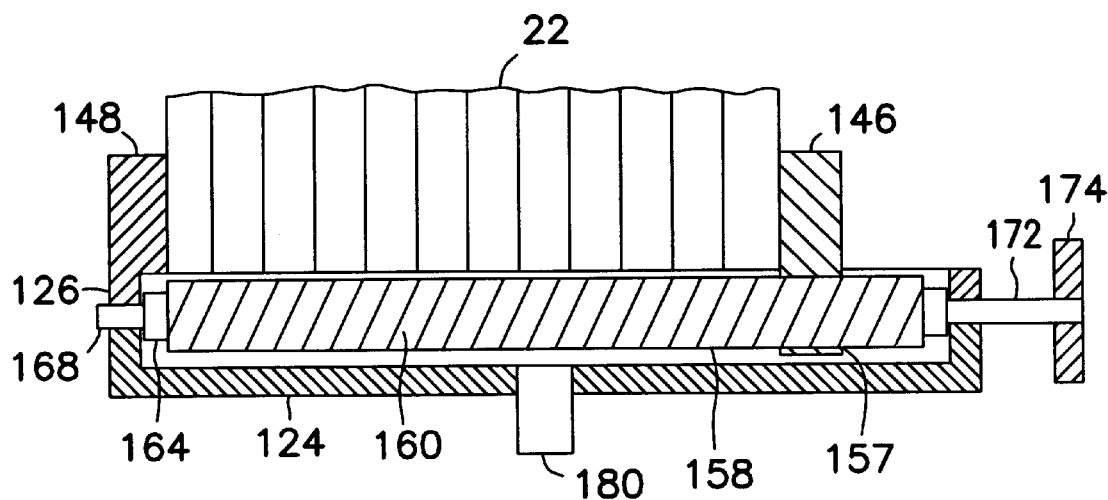
FIG. 7 is a partial section view taken along line 7—7 of FIG. 6 wherein the clamp body, the clamp plate, the clamp member, and the thumb-wheel are shown in section.

Another exemplary embodiment of the sample mount of the present invention is shown in FIGS. 6 and 7. Here, a sample mount 110 is shown. While similar in most respects to the sample mount 10, the sample mount 110 differs in that one clamp member defines a fixed (relative to the clamp body) clamp face. That is, the clamp body 126 additionally includes an upwardly extending clamp face 148 such that the clamp body 126 is a generally L-shaped member. A centrally located slot 134 is disposed perpendicularly to the clamp face 148 and extends through the clamp body 126. In opposing relationship to the clamp face 148 is a generally T-shaped clamp member 146 having a first or upper generally horizontal portion 150 and a second or lower generally vertical portion 152. The upper horizontal portion 150 forms a specimen holding face similar to clamp face 148. The lower vertical portion 152 slidably nests within the slot 134. The clamp member 146 can move toward or away from the clamp face 148 by merely sliding within slot 134. The lower vertical portion 152 also includes a threaded hole 157 through which a lead screw 158 passes as shown in FIG. 7.

Referring to FIG. 7, the lead screw 158 is retained in a fashion substantially identical to that shown by the lead screw 58 in FIG. 4. However, the lead screw 158 comprises a unitary threaded portion 160 instead of the dual thread of the lead screw 58. Like the embodiment described in FIG. 4, the lead screw 158 is retained by a first non-threaded portion 164 and a second non-threaded portion 168 located at each end of the lead screw. A thumb-wheel 174 is attached to an extended portion 172 of one of the second non-threaded portions 168. The thumb-wheel 174 is preferably knurled on its outer diameter to permit easy turning by hand.

When assembled, the threaded portion 160 threadably engages the threaded hole 157 of the clamp member 146. Rotational motion of lead screw 158 in a first direction causes the clamp member 146 to move toward the clamp face 148 while rotation of the lead screw in a second direction causes the clamp member to move away from the face 148. The operator may therefore change the distance between the clamp member 146 and the clamp face 148 merely by turning the thumb-wheel 174.

As with the embodiment shown in FIG. 2, the sample mount 110 shown in FIG. 6 also includes a pin 180 extending downwardly from the plate 124. Preferably, the pin 180 is received by the central opening 82 in the base 14. A socket set screw (not shown) may be threadably engaged with a threaded hole (also not shown) in the base to secure the pin 180 relative thereto.

To assemble the embodiment shown in FIGS. 6 and 7, the clamp member 146 is slightly threaded onto the lead screw 158. The opposite end of the lead screw may then be inserted into the slot 134 and the clamp member 146 slid toward the clamp face 148 until the opposite end of the lead screw 158 can also drop through the slot 134. Unlike the embodiment shown in FIGS. 2–5, splitting of the clamp body 126 is not required. The clamp body 126 may then be attached to a plate 124 and the lead screw 158 positioned such that it is retained in a manner substantially identical to that discussed regarding the lead screw 58. Four fasteners (not shown) secure the clamp body 126 to the plate 124. The thumb-wheel 174 may then be secured to the extended portion 172 of the lead screw 158.

In use, the sample mount 110 is inserted and secured to the base 14. Sample 22 may then be placed between the clamp member 146 and the clamp face 148 and the thumb-wheel 174 may be rotated in the first direction. As the thumb-wheel is turned, the clamp member 146 moves toward the clamp face 148 until the sample 22 is sandwiched therebetween. The clamping force applied to the sample 22 can be varied proportionally to the amount of torque applied to the thumb-wheel 174. Adjustment of the sample location relative to the SEM can be made by selectively energizing the motor 20 to drive the base 14 within the rail 16. Alternatively, the mount 110 may be rotated within the base.

To release the sample after inspection, the thumb-wheel is simply rotated in the second direction, thereby releasing the sample 22 from the clamp member 146 and clamp face 148. A second sample may then be inserted and aligned for inspection.

The present invention provides an improved sample mount that permits quick and efficient edge mounting of wafer samples within a SEM. Furthermore, mounting is accomplished without the use of messy adhesives and tapes. By avoiding the use of adhesives, the sample mount does not require the lengthy cure time often associated with adhesive mounts. Advantageously, inspection throughput is increased, preventing wafer inspection from becoming a production bottleneck.

In the embodiments herein represented, all components are made from 300 series stainless steel. This material was selected for its excellent corrosion and chemical resistance. Nonetheless, other materials are also considered to be within the scope of the invention.

Exemplary embodiments of the present invention are described above. Those skilled in the art will recognize that many embodiments are possible within the scope of the invention. Variations, modifications, and combinations of the various parts and assemblies can certainly be made and still fall within the scope of the invention. Thus, the invention is limited only by the following claims, and equivalents thereto.

I claim:

1. A sample mount for an electron microscope comprising:
   a first clamp member;
   a second opposing clamp member, the clamp members being capable of securing a sample therebetween; and
   a lead screw operatively connected to both clamp members, whereby rotation of the lead screw varies the distance between the clamp members.

2. A sample mounting assembly for an electron microscope comprising:
   a base having a central opening; and
   a sample mount removably connected to the base, the sample mount having:
   a first clamp member;
   a second opposing clamp member, the clamp members being capable of securing a sample therebetween; and
   a lead screw operatively connected to the first and second clamp members,
   whereby rotation of the lead screw varies the distance between the clamp members.

3. The mounting assembly of claim 2 further comprising a rail, the base being adjustably positionable relative to the rail.

4. The mounting assembly of claim 2 further comprising means to retain the sample mount within the base.

5. The mounting assembly of claim 4 wherein the retaining means comprises a pin disposed on the sample mount wherein the central opening on the base receives the pin when the sample mount is connected to the base.

6. The mounting assembly of claim 2 wherein the lead screw additionally comprises means to assist in turning the lead screw.

7. The mounting assembly of claim 2 wherein both clamp members are movable relative to the base.

8. The mounting assembly of claim 2 wherein one clamp member is fixed relative to the base.

9. A sample mount for retaining a sample for viewing with an electron microscope comprising:
   a retaining assembly comprising:
   a plate having a first side and a second side; and
   a clamp body having a first side and a second side, the first side of the clamp body being removably attached to the first side of the plate;
   a first clamp member operatively connected to the retaining assembly;
   a second opposing clamp member operatively connected to the retaining assembly, the clamp members being capable of securing the sample therebetween; and
   a lead screw secured to the retaining assembly and operatively connected to the first and second clamp members.

10. A sample mount for retaining a sample for viewing with an electron microscope comprising:
    a retaining assembly comprising:
    a plate having a first side and a second side; and
    a clamp body having a first side and a second side, the first side of the clamp body being removably attached to the first side of the plate;
    a first clamp member operatively connected to the retaining assembly;
    a second opposing clamp member operatively connected to the retaining assembly, the clamp members being capable of securing the sample therebetween; and
    a lead screw secured to the retaining assembly and operatively connected to the first and second clamp members, wherein the plate further comprises a pair of opposing tabs extending away from the first side of the plate, the tabs being spaced apart by a tab separation.

11. The sample mount of claim 10 wherein each tab has a centrally located first convex radius.

12. The sample mount of claim 11 wherein the first side of the clamp body defines a pair of opposing recesses for receiving the tabs, each recess having a second centrally located convex radius substantially equal in size to the first convex radius such that when the plate is attached to the clamp body, the interrelation of the first and second convex radii define a pair of opposing cylindrical openings, the openings having a retaining diameter.

13. The sample mount of claim 12 wherein the clamp body has a centrally located slot therein extending generally between the opposing recesses, the slot having a slot width.

14. The sample mount of claim 13 wherein the clamp body is separable into a first half and a second half.

15. The sample mount of claim 14 wherein the first half is separable from the second half along a line generally perpendicular to the slot.

16. The sample mount of claim 14 wherein the clamp members have a first portion and a second portion, the second portion having a width slightly less than the slot width such that the second portion of each clamp member nests within the slot of the clamp body.

17. A sample mount for retaining a sample for viewing with an electron microscope comprising:
 a retaining assembly comprising:
  a plate having a first side and a second side wherein the first side comprises a pair of opposing tabs extending away from the first side and each tab has a centrally located first convex radius, the tabs being spaced apart by a tab separation; and
  a clamp body having a first side and a second side, the first side of the clamp body being removably attached to the first side of the plate, wherein the first side of the clamp body defines a pair of opposing recesses for receiving the tabs, each recess having a second centrally located convex radius substantially equal in size to the first convex radius such that when the plate is attached to the clamp body, the interrelation of the first and second convex radii define a pair of opposing cylindrical openings, the openings having a retaining diameter, and wherein the clamp body has a centrally located slot therein extending generally between the opposing recesses, the slot having a slot width;
 a first clamp member operatively connected to the retaining assembly;
 a second opposing clamp member operatively connected to the retaining assembly, the clamp members being capable of securing the sample therebetween, wherein the clamp members have a first portion and a second portion, the second portion having a width slightly less than the slot width such that the second portion of each clamp member nests within the slot of the clamp body, wherein the second portion of the first clamp member has a first threaded opening therein, said first threaded opening having a right-handed thread, and the second portion of the second clamp member has a second threaded opening therein, said second threaded opening having a left-handed thread; and
 a lead screw secured to the retaining assembly and threadably coupled to the first and second threaded openings.

18. The sample mount of claim 17 wherein the clamp body is separable into a first half and a second half.

19. The sample mount of claim 17 wherein the lead screw comprises:
 a central threaded portion having a minor diameter;
 a first end portion located at each end immediately adjacent to the central threaded portion wherein the first end portion and the central threaded portion together define a screw length which is slightly less than the tab separation; and
 a second non-threaded portion located immediately outboard of each first end portion, the second non-threaded portion having a second diameter.

20. The sample mount of claim 19 wherein the first end portion defines a first non-threaded portion having a first diameter.

21. The sample mount of claim 20 wherein the first diameter is less than the minor diameter, and the second diameter is less than the first diameter and is also less than the retaining diameter such that, when installed in the retaining assembly, the second non-threaded portion is retained within the opposed cylindrical openings, permitting rotation of the lead screw but restraining it from longitudinal motion.

22. The sample mount of claim 21 wherein the central threaded portion of the lead screw further comprises a first threaded portion having a right-handed thread threadably engaged with a first threaded opening of the first clamp member and a second threaded portion having a left-handed thread threadably engaged with a second threaded opening of the second clamp member, whereby rotation of the lead screw in a first direction results in relative closure of the clamp members and rotation of the lead screw in a second direction results in relative separation of the clamp members.

23. The sample mount of claim 17 wherein the clamp members move toward and away from a common origin.

24. The sample mount of claim 17 wherein a thumb-wheel is secured to at least one end of the lead screw.

25. The sample mount of claim 17 wherein the retaining assembly, first and second clamp members, and the lead screw are removably secured to a base.

26. A sample mount for use with an electron microscope comprising:
 a retaining assembly comprising:
  a plate having a first side and a second side; and
  a clamp body having a first side and a second side, the first side of the clamp body being removably attached to the first side of the plate and the second side of the clamp body defining a fixed clamp face;
 a clamp member operatively connected to the retaining assembly; and
 a lead screw secured to the retaining assembly and operatively connected to the clamp member.

27. A sample mount for use with an electron microscope comprising:
 a retaining assembly comprising:
  a plate having a first side and a second side; and
  a clamp body having a first side and a second side, the first side of the clamp body being removably attached to the first side of the plate and the second side of the clamp body defining a fixed clamp face;
 a clamp member operatively connected to the retaining assembly; and
 a lead screw secured to the retaining assembly and operatively connected to the clamp member, wherein the plate further comprises a pair of opposing tabs extending away from the first side of the plate, the tabs being spaced apart by a tab separation.

28. The sample mount of claim 27 wherein each tab has a centrally located first convex radius.

29. The sample mount of claim 28 wherein the first side of the clamp body defines a pair of opposing recesses for receiving the tabs, each recess having a second centrally located convex radius substantially equal to the first convex radius such that when the plate is connected to the clamp body, the interrelation of the first and second convex radii define a pair of opposing cylindrical openings, the openings having a retaining diameter.

30. The sample mount of claim 29 wherein the clamp body has a centrally located slot therein extending generally between the opposing recesses, the slot having a slot width.

31. The sample mount of claim 30 wherein the clamp member has a first portion substantially identical in size and in opposing relation to the clamp face, and a second portion, the second portion having a width slightly less than the slot width such that the second portion of the clamp member nests within the slot of the clamp body.

32. The sample mount of claim 31 wherein the second portion of the clamp member has a threaded opening therein.

33. A sample mount for use with an electron microscope comprising:
- a retaining assembly comprising:
  - a plate having a first side and a second side wherein the first side comprises a pair of opposing tabs extending away from the first side and each tab has a centrally located first convex radius, the tabs being spaced apart by a tab separation; and
  - a clamp body having a first side and a second side, the first side of the clamp body being removably attached to the first side of the plate and the second side of the clamp body defining a fixed clamp face, wherein the first side of the clamp body defines a pair of opposing recesses for receiving the tabs, each recess having a second centrally located convex radius substantially equal in size to the first convex radius such that when the plate is attached to the clamp body, the interrelation of the first and second convex radii define a pair of opposing cylindrical openings, the openings having a retaining diameter, and wherein the clamp body has a centrally located slot therein extending generally between the opposing recesses, the slot having a slot width;
- a clamp member operatively connected to the retaining assembly wherein the clamp member has a first portion substantially identical in size and in opposing relation to the clamp face, and a second portion, the second portion having a width slightly less than the slot width such that the second portion of the clamp member nests within the slot of the clamp body and wherein the second portion of the clamp member has a threaded opening therein; and
- a lead screw secured to the retaining assembly and operatively connected to the clamp member.

34. The sample mount of claim 33 wherein the lead screw comprises:
- a central threaded portion having a minor diameter;
- a first end portion located at each end immediately adjacent to the central threaded portion wherein the first end portion and the central threaded portion together define a screw length which is slightly less than the tab separation; and
- a second non-threaded portion located immediately outboard of each first end portion, the second non-threaded portion having a second diameter.

35. The sample mount of claim 34 wherein the first end portion defines a first non-threaded portion having a first diameter.

36. The sample mount of claim 35 wherein the first diameter is less than the minor diameter and the second diameter is less than the first diameter and is also less than the retaining diameter such that, when installed in the retaining assembly, the second non-threaded portion 6 retained within the opposed cylindrical openings, permitting rotation of the lead screw but restraining it from longitudinal motion.

37. The sample mount of claim 36 wherein the central threaded portion is threadably engaged with the threaded opening of the second portion of the clamp member, whereby rotation of the lead screw in a first direction results in movement of the clamp member towards the clamp face and rotation of the lead screw in a second direction results in movement of the clamp member away from the clamp face.

38. The sample mount of claim 33 wherein a thumb-wheel is secured to at least one end of the lead screw.

39. A method of retaining a sample for examination in an electron microscope comprising:
- securing a sample mount to a base;
- inserting a sample into the sample mount; and
- turning a lead screw of the sample mount in a first direction to move a first clamp member toward a second clamp member thereby securing the sample therebetween.

40. The method of claim 39 further comprising securing a plurality of silicon wafers between the clamp members to form the sample.

41. The method of claim 39 further comprising turning the lead screw in a second direction to move the first clamp member away from the second clamp member thereby releasing the sample.

42. The method of claim 39 further comprising providing a thumb-wheel to assist in turning the lead screw.

43. A method of retaining a sample for examination in an electron microscope comprising:
- securing a sample mount to a base;
- inserting a sample into the sample mount;
- turning a lead screw in a first direction to move both a first clamp member and a second clamp member toward the sample thereby securing the sample therebetween; and
- turning the lead screw in a second direction to move both the first clamp member and the second clamp member away from the sample thereby releasing the sample.

44. The method of claim 43 further comprising securing a plurality of silicon wafers between the clamp members to form the sample.

45. The method of claim 43 further comprising providing a thumb-wheel to assist in turning the lead screw.

* * * * *

UNITED STATES PATENT AND TRADEMARK OFFICE
CERTIFICATE OF CORRECTION

PATENT NO.    : 6,414,322 B1
DATED         : July 2, 2002
INVENTOR(S)   : Lynn J. Carroll It is certified that error appears in the above-identified patent and that said Letters Patent is hereby corrected as shown below:

<u>Title page,</u>
Item [73], Assignee, delete "Boiae" and insert -- Boise --, therefor.

<u>Column 12,</u>
Line 9, delete "6" and insert -- is --, therefor.

Signed and Sealed this

Twenty-sixth Day of November, 2002

Attest:

Attesting Officer

JAMES E. ROGAN
Director of the United States Patent and Trademark Office